United States Patent [19]

Prame

[11] 4,344,069

[45] Aug. 10, 1982

[54] METHOD AND APPARATUS FOR CHARACTER GENERATION

[75] Inventor: Eric S. Prame, Lidingo, Sweden

[73] Assignee: International Business Machines Corp., Armonk, N.Y.

[21] Appl. No.: 95,897

[22] Filed: Nov. 19, 1979

[30] Foreign Application Priority Data

Nov. 21, 1978 [SE] Sweden .............................. 78119831

[51] Int. Cl.³ ............................ G08C 9/00; B41J 5/06
[52] U.S. Cl. ........................... 340/365 S; 340/365 R; 178/17 C; 400/100; 400/485
[58] Field of Search ............ 340/365 S, 365 R, 365 E, 340/365 A; 178/17 R, 17 A, 17 C, 79; 179/90 K, 90 R, 2 DP; 400/100, 472, 485, 486, 489

[56] References Cited

U.S. PATENT DOCUMENTS

| | | | |
|---|---|---|---|
| 3,225,883 | 12/1965 | Ayres | 340/365 R |
| 3,892,915 | 7/1975 | Budworth et al. | 340/365 E |
| 3,932,838 | 1/1976 | Sitter | 340/365 E |
| 3,967,273 | 6/1976 | Knowlton | 340/365 S |
| 3,973,256 | 8/1976 | Stoesser | 340/365 S |
| 4,007,443 | 2/1977 | Bromberg et al. | 340/365 S |
| 4,012,599 | 3/1977 | Meyer | 179/2 DP |
| 4,042,777 | 8/1977 | Bequaert et al. | 340/365 R |

OTHER PUBLICATIONS

Conway et al., "Communications of the ACM", vol. 10, No. 9, Sep. 1967, p. 539.

Primary Examiner—John W. Caldwell, Sr.
Assistant Examiner—Donnie L. Crosland
Attorney, Agent, or Firm—Edward H. Duffield

[57] ABSTRACT

Generation of a character code for an alphabetic character is performed by depressing at least two keys in a sequence. The code is generated when the last key is depressed and the other keys in the sequence still are pressed, or when all keys in the sequence are released. Numerical character codes are generated by depressing only one key per character. A logic and storage means is provided having a number of registers, code converting tables and control circuits for storing the history of depressed keys and for generating character codes.

6 Claims, 6 Drawing Figures

FIG. 1

METHOD AND APPARATUS FOR CHARACTER GENERATION

TECHNICAL FIELD

The present invention relates to a method and apparatus for character generation and more specifically to an alphanumeric one hand keyboard. A numerical character is generated by a single depression of a key and an alphabetic character is generated by depressing a sequence of keys.

PRIOR ART

The fast technological development in information handling and information transfer systems has created a need for improved and simplified apparatus for generation of numeric and alphabetic information. Often it is desirable to replace heavy and complicated keyboards operated with two hands with a small simple keyboard, which can be operated with one hand only. In this connection it is desirable that the one hand keyboard have as few keys as possible in order to minimize the size of the keyboard and to improve the operation of keys.

When a keyboard is used having relatively few keys it will be difficult to generate a large number of varying characters or character combinations. A solution for this problem is to use a number of keys for generation of a specific character, i.e., by combining selectively several keys it is possible to have a large number of combinations with relatively few keys. In this respect, there are two known possible methods. First, it is possible to depress two or several keys simultaneously in order to generate a character or a character combination. Secondly, it is possible to depress two or several keys in a sequence in order to generate a character or a character combination. U.S. Pat. No. 4,042,777 is an example of the first method.

The present invention relates to a variation and improved version of the second method, i.e., to such keyboards, where a character or a character combination is generated by depressing keys in a sequence. An example of such a keyboard is shown in U.S. Pat. No. 3,833,765. In accordance with this patent, the value of a first depressed key is stored in a first storage and the value of a second depressed key in a second storage. A character code information is then chosen depending on the content in said two storages. According to this arrangement, it is possible to use two keys, preferably in a keyboard comprising 3×4 keys, for generating all preferred character combinations.

A further development of this technique is shown in U.S. Pat. No. 3,967,273. According to this patent a standardized telephone keyboard having 3×4 keys is used. These keys are each marked in such a way that the depression sequence for two keys is clearly indicated by the marks.

A drawback for said known keyboard arrangement is that the circuits used for controlling such keyboards tend to be complicated. This will be especially evident if the keyboard is used in a terminal unit or if it is connected to a display device. Another problem in such keyboards is the risk for a fault depression. If a character information is generated, for instance by depression of two keys in a sequence, there is a risk that due to an extra depression or due to the failing of one depression, two wrong keys will be combined for producing one character. This risk will be specially evident if the operation speed for the keyboard will increase. A third drawback for prior art devices is the need of two depressions also for numeric characters, which will be specially unpractical in a keyboard having about ten keys.

It is an object for the present invention to provide an improved arrangement for depressing a number of keys in a sequence for generation of a character in which the circuits are simplified.

It is another object of the invention to provide an improved method for operating a keyboard device with one hand in which the risk for a fault operation is minimized.

Still another object of the invention is to provide an improved method of operating a keyboard whereby alternatively one or several depressions of keys can be made for generation of various characters.

BRIEF DESCRIPTION OF DRAWINGS

The invention will now be described in connection with the following figures illustrating various aspects of a preferred embodiment thereof.

FIG. 1 illustrates a keyboard layout according to the present invention.

SUMMARY

Figure 2:
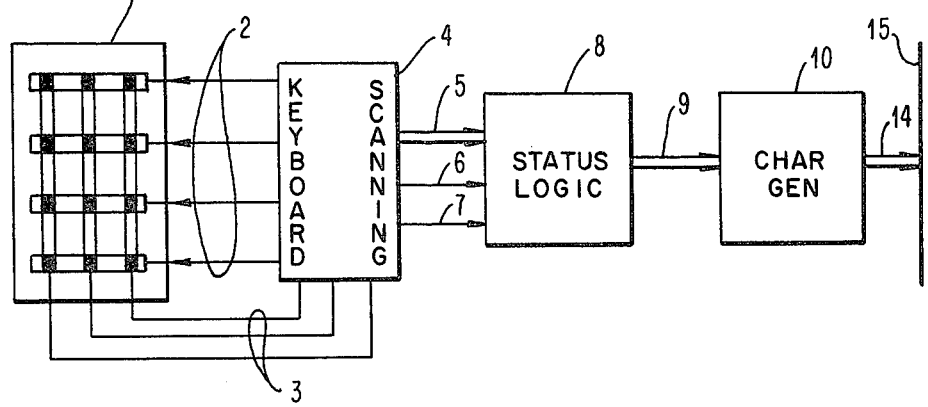
FIG. 2 illustrates a block diagram of a keyboard having control circuits in accordance with the present invention.

According to the present invention, the improvements referred to above and still others not enumerated are realized by providing a limited number of keys, for example a ten key numeric pad which will present numeric character codes upon single depressions of any of the keys. Alphabetic characters or other special characters are produced by the contemporaneous depression of two or more keys. Various possible key character codes are printed in a spacial relationship on each key button. The sequence of depression is determined by the position of the desired character code on the face of the key button and by the relative position of adjacent key buttons in the spacial array of key buttons on the keyboard. For example, should a desired character be located in the center of the top row of character codes on a given key button, then the first key to be depressed will be the center key button in the top row of key buttons on the keyboard and the second key depressed will be that key which has the character desired in the center of the top most row on the face of the button. Logic means and registers are employed for storing an indication of which keys have been depressed and/or released to keep track of possible mistakes of operation and to control the presentation of character scan codes to an encoding mechanism for the output of a numeric or alphabetical code in response to one or more key depressions.

DETAILED SPECIFICATION

Figure 1:
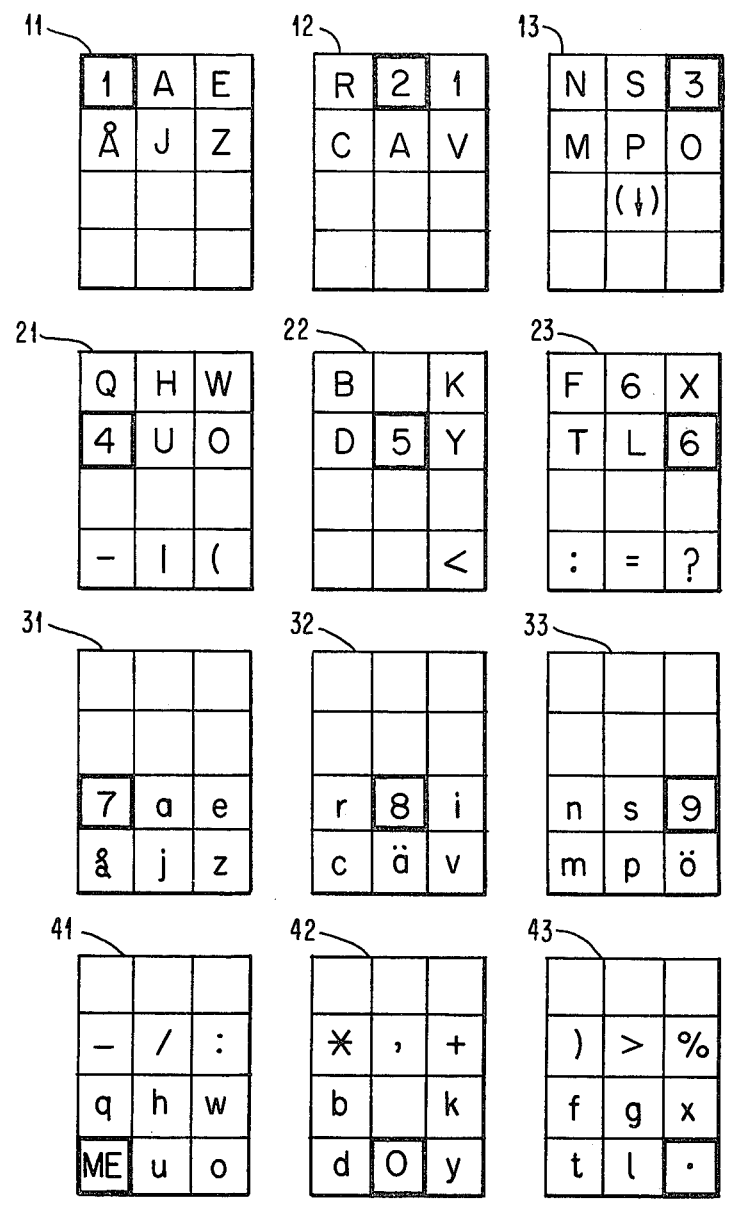

FIG. 1 shows a keyboard having an array of keys. The keys in this keyboard are arranged in rows and columns, whereby the keys in the top most row are marked with reference numerals 11 to 13, in the second row with the reference numerals 21 to 23, in the third row with 31 to 33 and the fourth row with 41 to 43. There are a number or markings on each key defining the function of the key. It can be seen that key number 11 has the markings 1, A, E, A, J, Z and key number 12 has markings R, 2, I, C, Ä, V and so on.

Referring further to FIG. 1 it can be seen that the keyboard comprises four various types of alphanumeric characters. First, there are numeric characters 1–9 placed all over the keyboard. Then, there are alphabetic characters from A to Ö (A to Z for English) found to be arranged as capital letters and as small letters, the capital letters being placed in the two top most rows 11–13 and 21–23, whereas the small letters are placed in the two lower most rows. Furthermore, there are special characters arranged substantially over the whole keyboard.

The keyboard is operating in two working modes. The first working mode is purely numeric and the second working mode is an alphabetic mode. In numeric mode a key is depressed and released before the next key is depressed. If, for instance, a digit 5 should be produced, the key 22 will be depressed, whereafter this key is released. If then a number 38 should be produced, the key 13 is first depressed, then this key is released, thereafter the key 32 is depressed and then this later key is released.

In alphabetical mode, two keys are depressed in a sequence in such a way that the first key will not be released before the second key is depressed. If, for instance, a character A should be generated, a first key 12 is depressed, then the key 11 is depressed, and then both keys 11 and 12 are released (simultaneously or in random sequence).

It can be seen that the keys in FIG. 1 are labeled with alphabetic letters in such a way that the occurrence of a letter on a key means that this key should be depressed as key number 2 in a sequence. The location of the letter on the key defines the position for the first key to be depressed in the sequence. In said example for generation of the character A, the key 11 is depressed as the second key in the sequence since the picture of the letter A exists on the key 11. However, the key 12 will be chosen as the first key to be depressed in view of the location of the letter A in the middle of the top most row of possible character codes on the key 11, corresponding to the position of key 12 relative to key 11, i.e., the middle key in the top most key row.

The keyboard in FIG. 1 is designed to use the two upper key rows for capital letters, whereas the two lower key rows are used for small letters. This arrangement will avoid the disadvantage of long jumps when moving from an upper key row to a lower key row for character generation. For the more rare special characters, however, keys are used in all rows. (An alternative method for generation of capital letters and small letters is, of course, the use of one or several shift keys.)

In accordance with FIG. 1, it can be seen that for generation of, for instance, a character "C", the key 41 is first depressed, then the key 32 and thereafter both keys 41 and 32 are released. If, however, a special character should be generated, for instance a "plus" character, the key 23 is first depressed and then the key 42, thereafter both these keys are released.

It can further be seen that a space is generated by depressing the key 41 and releasing this key before any other key is depressed. Further, it can be seen that depressing of the key 43 without combining it with any other key will generate a point, which can be used as a decimal point in numeric text.

If the keyboard is used as a terminal keyboard for controlling a display, then it is natural that the empty squares on the keys are labeled for controlling the display; for instance, for cursor movement and other control functions. Hence, it is possible to assume that an arrow pointing downward below letter P on the key 13 means that the cursor should be moved downward on the display. This function is accomplished by depressing first key 32 and then depressing the key 13 whereafter both these keys are released.

In order to completely control a display there might be a need for up to thirty special keys. This is, however, no problem for a keyboard according to FIG. 1 having empty squares on the keys in a number exceeding fifty.

FIG. 2 illustrates a first embodiment of the control circuits to be used for controlling the keyboard in accordance with the function described in connection with FIG. 1.

In accordance with FIG. 2 the circuit 1 comprises the keyboard having input lines 2 and output lines 3. These input and output lines are connected to a keyboard scanning circuit 4. The scanning circuit 4 is connected to a status logic circuit 8 by means of a data channel 5 and by a signal line "key closed" 6 and a further signal line "all keys released" 7.

The status logic circuit 8 is connected to a character generator 10 by means of a second data channel 9. The character generator 10 is connected by means of an additional data channel 14 to a user unit 15.

The circuit of FIG. 2 will now be described in connection with a status diagram according to FIG. 3. Initially no key is depressed and this status is called T1 according to FIG. 3. Depressing of the first key on keyboard 1 will be sensed by the scanning circuit 4 by means of an output signal on line 2 and an input signal on line 3. The keyboard status is now changed from T1 to T2 in FIG. 3 over the line 34. The status 2 means a depressed key. From this status T2, it is possible to go over line 36 to the status T3, which means two depressed keys, or over line 35 back to status T1, when the depressed key is released. From a status T3 with two depressed keys it is only possible to go back to status T1 over line 37 when said two depressed keys are released.

According to FIG. 2 it can be seen that when changing from state T1 to T2 the keyboard scanning circuit 4 will sense the value of the depressed key. Then, this value is transferred as a key code from the circuit 4 over the data channel 5 to the state logic circuit 8, whereby a signal "key depressed" on the line 6 is transferred from the circuit 4 to the circuit 8. The system is now in the state T2 and the key code for the depressed key is stored in circuit 8.

It is supposed that the first depressed key should operate as a numeric key. The next step of operation will therefore be a release of the depressed key, and, according to FIG. 3, a transfer from the status T2 to the status T1 over the line 35. According to FIG. 2, this means that the circuit 4 will sense the release of the depressed key and transfer a signal "all keys released" over the line 7 to the circuit 8. The status circuit 8 now knows that the stored key code is a final result for a key depression sequence and this code is transferred over the transfer channel 9 to the character generator 10. The character generator 10 translates the key code to a numeric character code and transfers this numeric character code over the channel 14 to the user unit 15. The key code transferred over the channel 5 is preferably a code with four bits whereas the character code transferred over the channel 14 is preferably a character code with eight bits.

When an alphabetic character should be generated the operation from the status T1 to the status T2 will be the same as described for the numeric function. The first key will be sensed by the circuit 4, a signal will be generated on the line 6 and the key code for the first key will be transferred over the channel 5 to the status logic circuit 8. Thereafter, the second key will be depressed without releasing the first one, whereby the status will change from T2 to T3 according to FIG. 3 over the line 36. The keyboard scanning circuit 4 will now sense the second depressed key in the keyboard 1 and generate a signal on the line 6 to the status logic circuit 8 stating that a key has been depressed, and transfers a key code for said second key from the circuit 4 via the channel 5 to the circuit 8. The status logic circuit 8 has now stored the key codes for two depressed keys. When said two depressed keys are released, the status according to FIG. 3 will change from T3 to T1 over the line 37. This will be sensed by the circuit 4, which will deliver a signal stating that all keys are released over the line 7 to the circuit 8. The status logic circuit 8 can transfer said two stored key codes over the channel 9 to the character generator 10. The character generator 10 translates the information for said two input key codes into a corresponding alphabetic character code and transfers it over the channel 14 to the user unit 15.

It should be observed that the character generator 10 should be able to decide which one of said two input key codes represents the first key code and which one represents the second key code. Then, the right alphabetic character code can be generated. It should also be observed that the transfer from the circuit 8 to the circuit 10 does not necessarily need to happen in connection with a gate signal on the line 7. This transfer can also be performed in connection with the occurrence of two signals on the line 6, which clearly indicates that two key codes have been transferred from the circuit 4 to the circuit 8. This means that the alphabetic character code is transferred to the user unit 15 immediately when the status T3 will be reached, i.e., before the transfer from T3 to T1 in FIG. 3 over the line 37, which means before the release of said two depressed keys.

Figure 4:
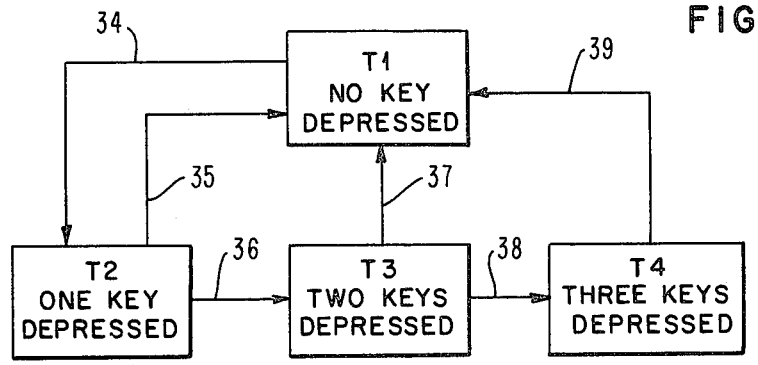
FIG. 4 illustrates a state diagram according to a second embodiment of the present invention.

It is evident that the capacity of the keyboard 1 will be increased greatly by the acceptance of a depression of three keys in a sequence before any one of said three keys is released. This means that the number of special characters or the number of other alphabetic or numeric characters can be increased. FIG. 4 illustrates a status diagram for such an embodiment.

The status T1 means a status where no keys are depressed. From T1 it is possible to go over 34 to T2 when a first key is depressed. From T2 it is possible to go over 36 to T3 when a second key is depressed without a release of said first one. From T3, it is possible to go over 38 to T4, which means that a third key is depressed without the release of any previous key. From the status T2 it is also possible to go over 35 to T1, which means a release of said first depressed key. From T3 it is possible to go over 37 directly to T1, which means a release of said two depressed keys. From T4 it is possible to come over 39 to T1, which means a release of all said three depressed keys.

Figure 3:
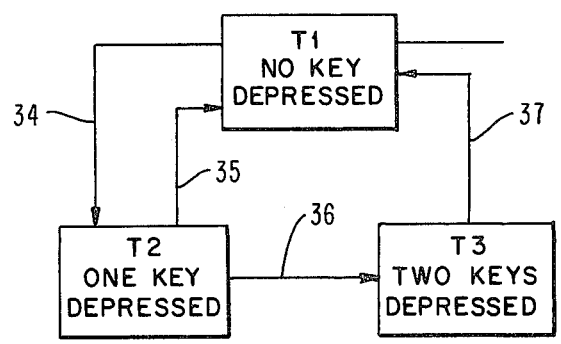
FIG. 3 illustrates a state diagram according to a first embodiment of the present invention.

The circuit according to FIG. 2 is in principle capable of scanning a keyboard and of generating a character in accordance with FIG. 4 in a same way as for status according to FIG. 3. The status logic circuit 8 will then store up to three key codes before a transfer will occur to the character generator 10. The criterium for a transfer will then be decided by the receipt of three signals on the signal line 6 or by a condition stating that a signal has been received earlier on the line 7. Further, the character generator 10 should be able to generate a number of character codes represented by one key code, two key codes or three key codes.

According to FIG. 5, another embodiment for the control circuits for the keyboard will now be described.

A keyboard 1 is connected to a data bus 55 over an input gate 62, input line 2, output line 3 and an output gate 63. A control unit 51 is also connected to said data bus 55 over an output line 69 and an input line 68. Further, an arithmetic logic unit 54 is connected to the data bus 55 over an output line 71 and an input line 72.

A storage 56 is connected to the data bus 55 over an input line 65 and an output line 66. The storage comprises an input register 61, an output register 57, a first table 60, a second table 80 and a number of registers R1–R5. The data bus 55 is further connected to an output circuit 15 over an output register 73 and an output channel 14.

The circuit according to FIG. 5 will now be described in detail. It is supposed that the keyboard 1 can be in three states corresponding to those shown in FIG. 3, i.e., status T1 with no key depressed, status T2 having one key depressed and status T3 having two keys depressed. It is, however, apparent that the circuit also can be used for such keyboard operations comprising status for additionally depressed keys in a sequence, for instance, for a status model as shown in FIG. 4.

An operation for generation of an alphabetical character code will now be described.

The operation starts with a transfer of a key code for the first key to be scanned into a register R1 in storage 56. It is assumed that this key is key number 11 in FIG. 1 having the numerical value 1. The key code for 1 is therefore stored in the register R1. By means of the key code 1, a bit pattern is read from the table 1 in the storage 56 for scanning the key number 1 on the keyboard. By means of this control code, the gates 62 and 63 are controlled in such a way that the key 11 having the value 1 will be scanned. If this key is not depressed, the next key on the keyboard will be scanned, i.e., the key 12, according to FIG. 1 having the value 2. This is accomplished by reading out the key code from the register R1 in storage 56 over the output 66, the data bus 55, the input 72 to the arithmetic logic unit 54. The key code will be incremented by one, i.e., from one to two, and is retransferred over the lines 71, 55 and 65 to the register R1 in the storage 56. Then, the new key code in R1 will be used for addressing the table 1 in the storage 56. The control bits for the key code 2 will then be read out from the table 1, whereafter the second key on keyboard 1 will be scanned in the same way as the first key. This operation will continue key by key whereby the current key code for the scanned key always will be in register R1 in the storage 56.

When the sequential scanning of keys on keyboard succeeds in scanning a depressed key, the current key code from register R1 will be transferred to register R2. The register R2 will then store a code for a depressed key. According to FIG. 3, this means a transfer from status T1 having no keys depressed to the status T2 having one key depressed.

In the next operation, it is important to decide whether the depressed key is a numeric key or whether a succeeding key will be depressed in order to generate an alphabetical character. Hence, the key code in the register R2 cannot yet be used for identifying a character code. Therefore, the control unit 51 will initiate a new scanning sequence of the keyboard 1. This starts with loading the register R1 again with the key code for the first key. Then control bits for this first key will be addressed from the table 1 and this key will be scanned. If this first key is not depressed, the key code will be incremented in the register R1. Then, the second key on the keyboard 1 will be scanned in the same way. When the scanning of keys continues, one depressed key will finally be found. The key code for this depressed key will be located in the register R1. It is now important to decide whether this key is the same as the one which was depressed during the previous scanning cycle. Therefore, the key codes in R1 and R2 will be transferred to the arithmetic logic unit 54. The current key code R1 will then be compared with the previous key code R2. If this comparison will indicate equal, it means that the same key as previously has been located. The scanning of the other keys on the keyboard 1 will then continue and the register R1 will be continuously updated.

The scanning of the keyboard 1 will then continue scanning cycle after scanning cycle until a new depressed key will be encountered having a key code in R1, which differs from the key code in the register R2.

When a second depressed key has been encountered on scanning the keyboard, i.e., when the comparison between the current key code in the register R1 and the previous key code in the register R2 indicate unequal in arithmetic logic unit 54, these two key codes will be used for addressing the table 2 in the storage 56. The table 2 will then present a character code to the output 66 and to the data bus 55 corresponding to the alphabetic character or special character defined by the current key code and the previous key code. If it is supposed as an example that the previous key code has a value 4 corresponding to the depression of the key 21 in FIG. 1 and the current key code has a value 2 corresponding to key 12, the table 2 will provide a character code for the character C. This character code is preferably an 8 bits EBCDIC code.

Figure 5:
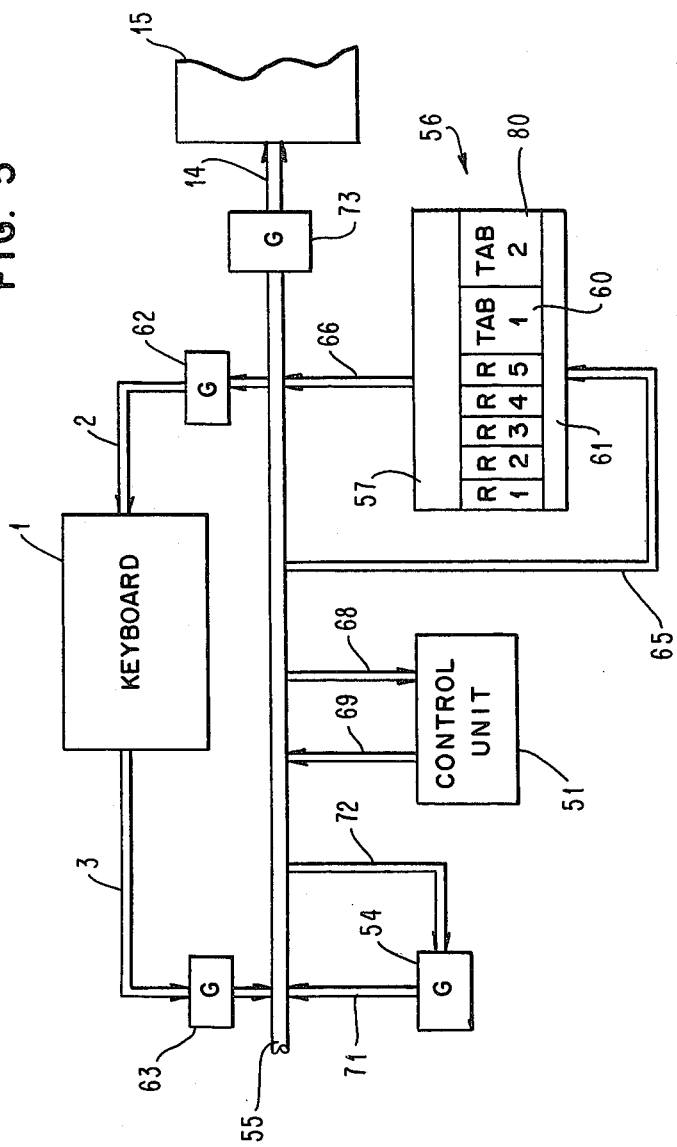
FIG. 5 illustrates a block diagram of a keyboard and control circuits for controlling keyboard operations according to the state diagram in FIGS. 3 and 4.

When the scanning system according to FIG. 5 has located a second pressed key on the keyboard 1, this corresponds to the status T3 of FIG. 3. When the system is in the status 3, the character code will first be transferred from the data bus 55 over the output register 73 and the output line 14 to the user 15. Thereafter, the system will start to scan the keyboard 1 cycle after cycle until a status will be found with no keys depressed. This means according to FIG. 3 a transfer from the status T3 over line 37 to the status T1. Then a new scanning of keyboard 1 can start for locating a new depressed key.

The operation for generation of a numerical character code will now be described. According to FIG. 3, this means a start from the status T1 without any key depressed, a transfer over the line 34 to the status T2 with one depressed key and going back over line 35 to the status T1, whereby the depressed key is released.

In accordance with FIG. 5, the control unit 51 will indicate the keyboard scanning operation in the same way as described above. The current key code will then be updated continuously in the register R1 and when a depressed key is encountered in the keyboard 1, the key code for this key will be transferred to R2 as described above. When the scanning of the keyboard 1 then continues, there will finally occur a scanning cycle whereby no depressed key will be encountered. This will clearly indicate for the control unit 51 that the concerned key is a numeric one. The content in the register R2 is then transferred to the arithmetic logic unit 54. In this unit, two key codes having equal value are produced, whereafter this double key code is transferred over the lines 71, 55, 65 for addressing the table 2 in storage 56. A numerical character code corresponding to the stored key code in the register R2 will now be read from the table 2. This numerical character code will be transferred over the data bus 55 to the output register 73 and further to the user device 15.

It should be observed that the system according to FIG. 5 easily can consider a problem concerning a bouncing key. If, for instance, an alphabetical character code should be generated by first depressing a first key on keyboard 1 and then a second key on keyboard 1, a problem may arise in connection with depressing of said first key. If the key will bounce, the electronic scanning system according to FIG. 5 will first sense a depressed key and thereafter a released key, i.e., the system will erroneously register a numeric character code. This can be eliminated for instance by a register R3 in storage 56 working as a count down counter for a bouncing contact. This means that when a depressed key is encountered and the current key code is transferred to the register R2, the register R3 will be loaded for counting down a bouncing effect. This count down register R3 can then be decremented for instance with a one for each scanning cycle. When the scanning of the keyboard 1 gives as a result no depressed key, due to the bouncing effect, the value in the register R3 will be checked before a numeric character code will be read out from from the table 2. If the register R3 has not yet counted down to zero the scanning cycle resulting in no depressed key will be ignored. The value in the register R3 will preferably be cyclically decremented in the arithmetic logic unit 54.

In some systems, it might be desirable to allow the depressing of a third key before two previous keys have been released. If, for instance, two alphabetical characters should be generated, this means according to the previous description that a first key will be depressed and then a second key in the sequence whereafter both keys are released, then a third key will be depressed and a fourth key in the sequence whereafter these two letter keys are released. In such a case, it might be a practical advantage if the system can accept for instance the following keyboard operation: key 1 depressed, key 2 depressed, key 1 released, key 3 depressed, key 2 released and key 4 depressed, whereafter keys 3 and 4 are released.

Figure 6:
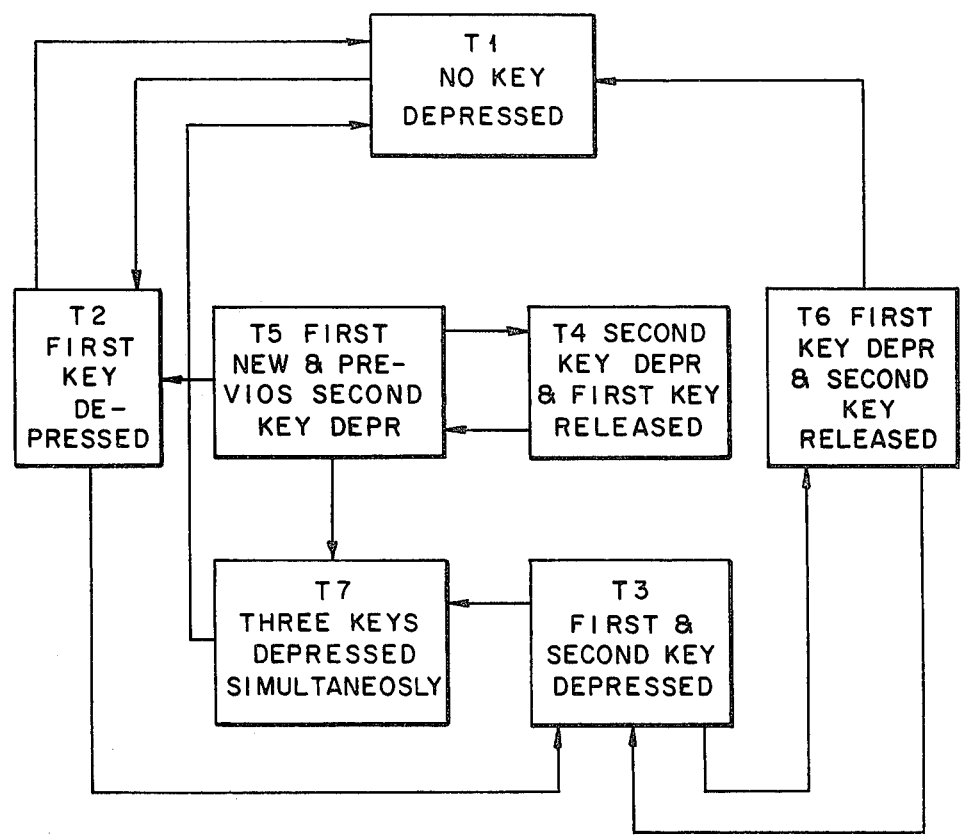
FIG. 6 illustrates a state diagram according to still another embodiment of the present invention.

FIG. 6 discloses a status diagram according to another embodiment adapted for above mentioned keyboard operation. The status T1 means no depressed key, the status T2 means a first key depressed and the status T3 means a first and a second key depressed, as earlier described in connection with FIG. 3. T4 means a status when the second key is depressed and the first one is released. T5 means status where the first new and the previous second key are depressed. T6 means a status where the first key is depressed and the second one is released. T7 means a status where three keys are or have been depressed simultaneously.

The sequence of the operation according to the example above where four keys are depressed in a sequence should then be according to FIG. 6 as follows:

No key depressed, T1. Key 1 depressed, T1→T2. Key 2 depressed, T2→T3, a first character code will be generated. Key 1 released, T3→T4. Key 3 depressed, T4→T5. Key 2 released, T5→T2. Key 4 depressed, T2→T3, a second character code will be generated. Key 3 released (alternatively key 4 released), T3→T4 (alternatively T3→T6). Key 4 released (alternatively key 3 released), T4→T1 (alternatively T6→T1).

It should be considered that according to the described operational sequence a first alphabetical character code will be generated when status T3 is reached, i.e., in a conventional way after the depression of the first and the second keys. The second character code, however, will be generated when the status T4, T5, T2 have been passed and the status T3 again has been reached.

In accordance with FIG. 5 it can be seen that the keyboard operation according to FIG. 6 well can be performed by using two additional registers, i.e., the registers R4 and R5 in the storage 56. One status T3 is reached during generation of the first alphabetical character according to FIG. 3 or FIG. 6, the key codes for the two depressed keys will according to the previous description be located in the registers R1 and R2. The content of these registers is then transferred to the registers R4 and T5, which means that the key code for the first key is located in R5 and the key code for the second key is located in R4. When the scanning of the keyboard 1 continues the still depressed keys 1 and 2 will be sensed. The current key code in R1 will then be compared with the values in R4 and R5. When the first key will be released, the key code in the register R5 will be reset leading to the status T4. When later the third key is depressed leading to the status T5, its key code will first be stored in R1 and then in R2, thereafter follows the release of the second key leading to a status T2 simultaneously with a reset of the key code in R4. Then the depressing of the fourth key leads to status T3 whereby the registers R1, R2 will contain the key codes for the third and the fourth key.

By storing the history of the depressed keys in registers R4 and R5 in the storage 56 and possibly in additional registers, it is possible to perform additional functions. According to FIG. 6 it can be seen that it is possible to go from status T3 having a first and a second depressed key to the status T6 having only the first key depressed. From T6 it is possible to go back to T3 by depressing the second key. Then it is possible to go back to T6 and again back to T3, etc., in a loop. Returning from T6 to T3 can then be defined as a repeating function of the alphabetical code for the keys 1 and 2. Hence, it is possible to repeat the same character several times by first depressing the first key, then the second key and thereafter releasing and depressing several times said second key. At the end the return is made from either T3 or T4 to the status T1 or from the status T6 to the status T1.

The status T7 will be reached by depressing three keys. The status T7 will be active as long as anyone of the keys are depressed. When this is not the case anymore, a return will be made to T1.

It is evident that suitable keyboard operations including more than two keys can be performed by means of storing the history of key codes. It is then essential that the table 2 will be modified so that a preferred alphabetical code can be read out and that the keyboard will be equipped with diodes or other means so that three simultaneous depressions of keys can be identified or that the keyboard will be equipped with corresponding identifying means.

Having thus described my invention, what I claim as new, and desire to secure by Letters Patent is:

1. A method of generating character codes by means of a keyboard having a plurality of keys arranged spatially in rows and columns, an electronic scanning means for scanning said keys to detect actuations thereof, and to produce key identification codes for said actuated keys, each of said keys bearing a plurality of potential symbols to be generated by depression of that key, said symbols being arranged in a spatial array on the face of said key, said keyboard also having an encoding means for generating character codes in response to the detection of actuated key codes produced by said scanning means, said method comprising steps of:

selecting a first key for depression from among the spatial array of said keys on said keyboard, said selection being in accordance with the relative spatial position in said array that said first key bears to the other keys on said keyboard, which relative spatial position corresponds to the relative position of the desired character symbol in its said spatial array of possible character symbols on the face of a second said key in said array;

depressing said first key and generating a key code therefor as the result of said scanning;

depressing said second key and generating a key code therefor in response to said scanning, said second key being the one on which said desired character symbol appears in the relative spatial relationship to other possible character codes on the face of said key, said relative spatial position corresponding to the relative spatial position of said first depressed key in said array of keys on said keyboard, said first key being maintained in a depressed state contemporaneously with the depression of said second key;

detecting the coincidence of contemporaneous depression of said first and second keys; and encoding a character code corresponding to the desired said character selected by the combined said codes produced by the depressions of said first and second keys.

2. The method as described in claim 1 wherein:
there is further included a step of detecting the release of said keys by scanning thereof with said scanning means; and
said encoding step is performed upon detection of the release of the last said key to be depressed.

3. Data entry keyboard apparatus comprising:
a plurality of actuable keys arranged in an array on the face of a keyboard;
a scanning circuit means for scanning said array of keys on the keyboard to determine the actuation of any keys and for generating a scanned key code indicative of an actuation of any of said keys;

a character generating means for generating character codes in response to the detection of actuated keys by said scanning means, said character generator having a storage means connected for receiving and storing and combining said key codes produced by said scanning means during a keyboard operating cycle which comprises the actuation of a number of selected keys in a given sequence with at least one key maintained depressed before the next key in a sequence is actuated, said character generator producing a key code data from the combination of said scanned key codes produced when a given number of said keys have been actuated.

4. Data entry keyboard apparatus comprising:

a plurality of actuable keys arranged in an array on the face of a keyboard;

a scanning circuit means for scanning said array of keys on the keyboard to determine the actuation of any keys and for generating a scanned key code indicative of an actuation of any of said keys;

a character generating means for generating character codes in response to the detection of release of actuated keys by said scanning means, said character generator having a storage means connected for receiving and storing and combining said key codes produced by said scanning means during a keyboard operating cycle which comprises the actuation of a number of selected keys in a given sequence with at least one key maintained depressed before the next key in a sequence is actuated, said character generator producing a key code data from the combination of said scanned key codes produced when a given number of said keys have been actuated.

5. Apparatus as described in claim 3 or 4 wherein:

said storage means in said character generator further comprises a status logic means having a data input connected to said keyboard scanning means and having a first control signal input for indicating that a key is depressed, a second control input indicating that all keys are released and a data output connected for driving said character generator.

6. Apparatus as described in claim 3 or 4 wherein:

said character generator means comprises a table memory for converting a plurality of key codes produced by said scanning means and presented thereto into a corresponding character output code, said corresponding character output code being selected in said table memory in response to the number of said key codes detected by said scanner before the release of any of said keys being detected.

\* \* \* \* \*